(12) United States Patent
Xu et al.

(10) Patent No.: US 10,181,468 B2
(45) Date of Patent: Jan. 15, 2019

(54) MEMORY CELL WITH ASYMMETRICAL TRANSISTOR, ASYMMETRICAL TRANSISTOR AND METHOD OF FORMING

(71) Applicant: GLOBALFOUNDRIES Inc., Grand Cayman (KY)

(72) Inventors: Ziyan Xu, Fishkill, NY (US); Chengwen Pei, Danbury, CT (US); Xusheng Wu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 16 days.

(21) Appl. No.: 15/338,512

(22) Filed: Oct. 31, 2016

(65) Prior Publication Data

US 2018/0122795 A1    May 3, 2018

(51) Int. Cl.

| | |
|---|---|
| *H01L 29/51* | (2006.01) |
| *H01L 29/66* | (2006.01) |
| *H01L 27/06* | (2006.01) |
| *H01L 49/02* | (2006.01) |
| *H01L 29/06* | (2006.01) |
| *H01L 29/78* | (2006.01) |
| *H01L 21/8234* | (2006.01) |

(52) U.S. Cl.
CPC .. *H01L 27/0629* (2013.01); *H01L 21/823418* (2013.01); *H01L 28/60* (2013.01); *H01L 29/0649* (2013.01); *H01L 29/517* (2013.01); *H01L 29/66553* (2013.01); *H01L 29/7835* (2013.01)

(58) Field of Classification Search
CPC ................................................. H01L 27/10805
See application file for complete search history.

(56) References Cited

U.S. PATENT DOCUMENTS

| | | | |
|---|---|---|---|
| 5,801,416 A | 9/1998 | Choi et al. | |
| 6,121,666 A | 9/2000 | Burr | |
| 8,445,974 B2 | 5/2013 | Chidambarrao et al. | |
| 2011/0163385 A1* | 7/2011 | Chidambarrao | ............................ H01L 21/823857 257/369 |
| 2013/0069132 A1* | 3/2013 | Atsumi | ............ H01L 27/10805 257/301 |

* cited by examiner

*Primary Examiner* — Moazzam Hossain
*Assistant Examiner* — Hajar Kolahdouzan
(74) *Attorney, Agent, or Firm* — Anthony Canale; Hoffman Warnick LLC

(57) ABSTRACT

An asymmetric transistor may be used for controlling a memory cell. The asymmetric transistor may include at least one gate stack having bottom to top: a gate dielectric layer having a planar upper surface and a uniform thickness extending atop the entirety of the device channel, a dielectric threshold voltage adjusting element including: a sloped dielectric element located on the planar upper surface of the gate dielectric layer, and a sidewall dielectric layer extending from the sloped dielectric element along a first sidewall of the opening space, and a gate conductor located atop an upper surface of the sloped dielectric element and along a side of the sidewall dielectric layer. The dielectric threshold voltage adjusting element creates a threshold voltage that is lower in a writing mode than in a storage mode of the memory cell.

17 Claims, 6 Drawing Sheets

MEMORY CELL WITH ASYMMETRICAL TRANSISTOR, ASYMMETRICAL TRANSISTOR AND METHOD OF FORMING

BACKGROUND

The present disclosure relates to data storage, and more specifically, to a memory cell employing an asymmetrical access transistor, the asymmetrical transistor, and a method of forming same.

Conventional digital memory storage devices employ a variety of memory cells in the form of capacitors. The capacitors can take the form of, for example, trench capacitors or back-end-of-line (BEOL) metal-insulator-metal (MIM) capacitors. BEOL refers to device forming operations performed on a semiconductor wafer in the course of device manufacturing following first metallization (e.g., a metal layer above a transistor layer). Each capacitor includes one or more pairs of conductors separated by an insulator that can store an electric charge. Each memory cell also includes one or more access transistors coupled to the capacitor thereof that control writing data (i.e., in the form of an electric charge) to the memory cell in a writing mode, or storing/retaining data in the memory cell in a storage mode. Transistors are semiconductor devices that act as switches in this setting, and include three terminals: a gate, a source and a drain. In memory cell access transistors, the source is typically coupled to the capacitor.

Memory cell access transistors are constructed to address a difficult balance of high performance and high data retention in the memory cell. These access transistors are designed/fabricated as symmetric transistors that have a single threshold voltage, which is the minimum voltage differential that must be applied from gate-to-source to create a conducting path between the source and drain terminals. In order to achieve high performance in a memory cell, threshold voltage (Vt) has to be low to keep power requirements low. However, the lower Vt diminishes the memory cell's ability to retain data because transistors constructed to have a low Vt also exhibit higher leakages from the capacitor. The leakages are referred to sub-threshold voltage leakage (Ioff) as induced by low Vt and gate induced drain leakage (GIDL) because it is caused, at least in part, by large field effects in the drain junction of the transistor. In contrast, in order to achieve longer data retention, Vt has to be higher, which reduces memory cell performance because more energy must be employed to activate the transistor. Since the symmetric access transistors operate on a single threshold voltage, it is very challenging to find a balance that provides high performance and long retention. This challenge has also been increased because of the ever-decreasing size of semiconductor devices.

SUMMARY

A first aspect of the disclosure is directed to a memory cell, including: a capacitor; and an asymmetric transistor for controlling access to the capacitor, the asymmetric transistor including a device channel located between a source and a drain, the source operatively coupled to the capacitor, and wherein the source has a higher threshold voltage than the drain.

A second aspect of the disclosure includes an asymmetric transistor for controlling a memory cell, the asymmetric transistor including: a semiconductor substrate including a device channel located between a source and a drain, the source operatively coupled to the memory cell; at least one gate stack located atop the device channel and within an opening space of a surrounding spacer, the at least one gate stack including, from bottom to top: a gate dielectric layer having a planar upper surface and a uniform thickness extending atop the entirety of the device channel, a dielectric threshold voltage adjusting element including: a sloped dielectric element located on the planar upper surface of the gate dielectric layer, and a sidewall dielectric layer extending from the sloped dielectric element along a first sidewall of the opening space, and a gate conductor located atop an upper surface of the sloped dielectric element and along a side of the sidewall dielectric layer, wherein the dielectric threshold voltage adjusting element creates a threshold voltage that is lower in a writing mode than in a storage mode of the memory cell.

A third aspect of the disclosure includes a method of forming an asymmetric transistor for controlling a memory cell, the method comprising: providing a semiconductor substrate including a device channel between a drain and a source, a dielectric layer over the drain and the source, and an opening space within a surrounding spacer within the dielectric layer, and wherein the source operatively couples to the memory cell; and forming a gate stack within the opening space by: forming a gate dielectric layer having a planar upper surface and a uniform thickness extending atop an entirety of the device channel, forming a dielectric threshold voltage adjusting element within the opening space, the dielectric threshold voltage adjusting element including: a sloped dielectric element located on the planar upper surface of the gate dielectric layer, and a sidewall dielectric layer extending from the sloped dielectric element along a first sidewall of the opening space, and forming a gate conductor located atop an upper surface of the sloped dielectric element and along a side of the sidewall dielectric layer, wherein the threshold voltage adjusting element creates a threshold voltage that is lower in a writing mode than in a storage mode of the memory cell.

A fourth aspect includes an asymmetric transistor, including: a semiconductor substrate including a device channel located between a source and a drain; at least one gate stack located atop the device channel and within an opening space of a surrounding spacer, the at least one gate stack including, from bottom to top: a gate dielectric layer having a planar upper surface and a uniform thickness extending atop the entirety of the device channel, a dielectric threshold voltage adjusting element including: a sloped dielectric element located on the planar upper surface of the gate dielectric layer, and a sidewall dielectric layer extending from the sloped dielectric element along a first sidewall of the opening space, and a gate conductor located atop an upper surface of the sloped dielectric element and along a side of the sidewall dielectric layer, wherein the sloped dielectric element is thicker adjacent a selected one of the source and the drain than the sloped dielectric element is adjacent the other one of the source and the drain, and a threshold voltage in a region adjacent the selected one of the source and the drain is higher than a threshold voltage in the other one of the source and the drain.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of the disclosure provide a memory cell that employs an asymmetric transistor with bimodal threshold voltage (Vt) to achieve both high performance in writing mode and long retention in storage mode. Embodiments of the disclosure also provide the asymmetric transistor apart from the memory cell, and a method of forming the same.

Referring to FIGS. 1-5, embodiments of a method of forming a memory cell 100 (FIG. 5) and an asymmetric transistor 102 (FIG. 5), i.e., an asymmetric field effect transistor (FET), will be described. FIGS. 1-3 and 5 show cross-sectional views of embodiments of the method of forming asymmetric transistor 102 (FIG. 5), and FIGS. 4A-B show schematic, cross-sectional plan and front views, respectively, of an intermediate step of the method according to embodiments of the disclosure.

Figure 1:
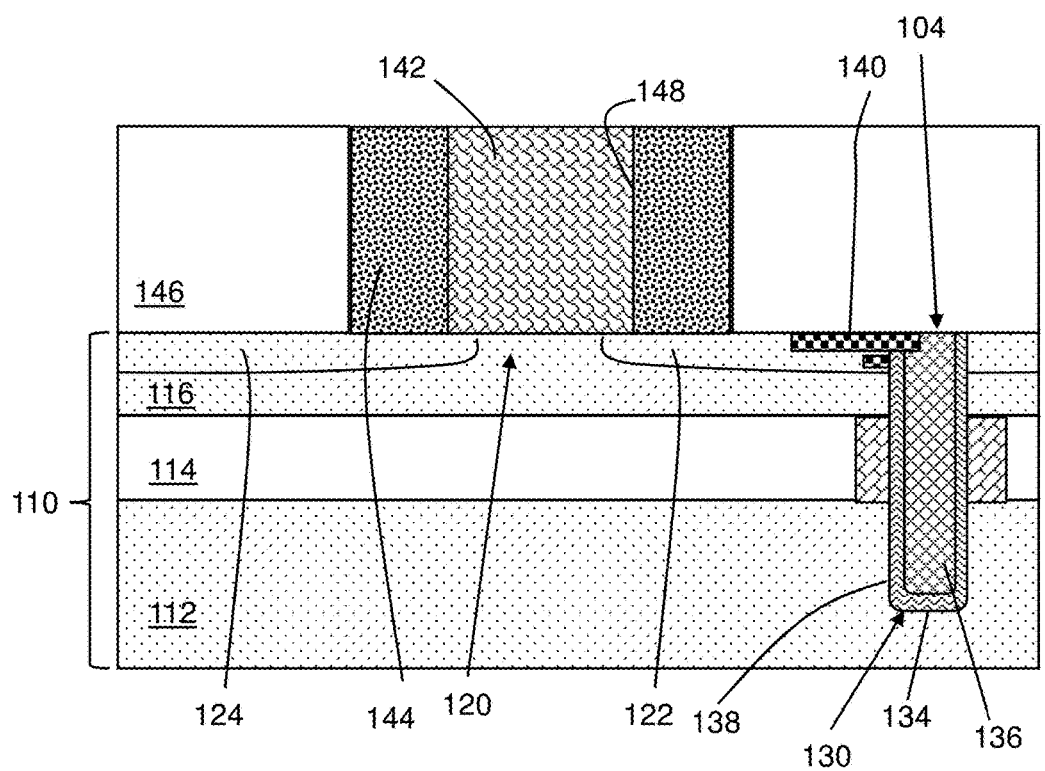
FIG. 1 shows a cross-sectional view of an initial structure of a method of forming an asymmetric transistor according to embodiments of the disclosure.

In FIG. 1, an initial structure at which processing according to embodiments of the disclosure starts is illustrated. As will be described, memory cell 100 including asymmetric transistor 102 may be formed in a semiconductor substrate 110. At this point, a semiconductor substrate 110 is provided. Substrate 110 may include bulk semiconductor or a semiconductor-on-insulator (SOI) substrate (shown). Here, the SOI substrate includes semiconductor underlayer 112, insulator layer 114, and SOI layer 116. Semiconductor underlayer 112 and SOI layer 116 may include but are not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or the entire semiconductor material in one or both layers may be strained. For example, SOI layer 116 may be strained. Insulator layer 114 may include any now known or later developed SOI substrate insulator such as but not limited to silicon oxide.

FIG. 1 also shows semiconductor substrate 110 is provided with a device channel 120 located between a source 122 and a drain 124 therein. Device channel 120, source 122 and drain 124 may be formed in SOI layer 116. Source 122 and drain 124 may be formed in any now known or later developed fashion, e.g., by implanting a dopant into SOI layer 116 (prior to interlayer dielectric (ILD) layer 146 formation thereon).

At this stage, a capacitor 104 of memory cell 100 may also be provided. Capacitor 104 may include any now known or later developed form of memory cell capacitor including but not limited to trench capacitors and back-end-of-line (BEOL) metal-insulator-metal (MIM) capacitors. In the non-limiting example shown in FIG. 1, capacitor 104 is in the form of a trench capacitor 130. Hence, it is shown being formed contemporaneously with source/drain 122, 124. BEOL MIM capacitors 204 (see FIG. 6), as understood in the art, would be provided in metal-insulator-metal layers formed in BEOL dielectric and metal layers above asymmetric transistor 102, i.e., formed thereafter. Trench capacitor 130 may include a node dielectric 134 and an inner electrode 136 in a trench 138 in substrate 110. Node dielectric 134 may include any now known or later developed insulator appropriate for forming a trench capacitor 130, e.g., silicon oxide, silicon nitride, silicon oxynitride, high-K material having a relative permittivity above about 10, or any combination of these materials. Examples of high-K material include but are not limited to metal oxides such as $Ta_2O_5$, $BaTiO_3$, $HfO_2$, $ZrO_2$, $Al_2O_3$, or metal silicates such as $HfSi_xO_y$ or $HfSi_xO_yN_z$, where x, y, and z represent relative proportions, each greater than or equal to zero and x+y+z=1 (1 being the total relative mole quantity). Inner electrode 136 material may include, for example, amorphous silicon, polycrystalline silicon (hereinafter "polysilicon"), germanium, silicon germanium, a metal (e.g., tungsten, titanium, tantalum, ruthenium, cobalt, copper, aluminum), a conducting metallic compound material (e.g., tungsten silicide, tungsten nitride, titanium nitride, tantalum nitride, ruthenium oxide, cobalt silicide, nickel silicide), or any suitable combination of these materials. Inner electrode 136 material may further include dopants. In one embodiment, inner electrode 136 material includes doped polysilicon. Trench 138 may be formed using any now known or later developed photolithography techniques prior to formation of gate stack 150 (FIG. 5), e.g., patterning a photoresist, and etching to form a mask and etching to form trench 138. Methods for forming node dielectric 134 and inner electrode 136 material include but are not limited to thermal oxidation, chemical oxidation, thermal nitridation, atomic layer deposition (ALD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, ion beam deposition, electron beam deposition and/or laser assisted deposition.

As illustrated, in this embodiment for use with memory cell 100, source 122 is operatively coupled to capacitor 104.

Source 122 may be operatively coupled to capacitor 104 in any now known or later developed fashion such as but not limited to a conductive strap 140, e.g., doped semiconductor or a conductor, coupling source 122 to inner electrode 136 of capacitor 104. It will be understood that other connecting structures, e.g., contacts and metal lines, may be employed depending on the type of capacitor employed.

At the stage shown in FIG. 1, a replacement metal gate (RMG) process dummy gate 142 has been formed over device channel 120. Dummy gate 142 may be formed using any now known or later developed photolithography and/or sidewall image transfer (SIT) techniques. For example, depositing a dummy gate 142 material such as polysilicon, patterning a photoresist thereover to form a mask, and etching to form dummy gate 142. Subsequently, as shown, a spacer 144 may be formed to surround dummy gate 142, and an interlayer dielectric (ILD) layer 146 may be deposited thereover. Spacer 144 may include any now known or later developed spacer material such as silicon nitride, deposited about dummy gate 142. Dummy gate 142 is thus within an opening space 148 of/within surrounding spacer 144.

ILD layer 146 may include any interlevel or intralevel dielectric material including inorganic dielectric materials, organic dielectric materials, or combinations thereof, deposited over spacer 144 and dummy gate 142. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning).

"Depositing," as used herein, may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 2:
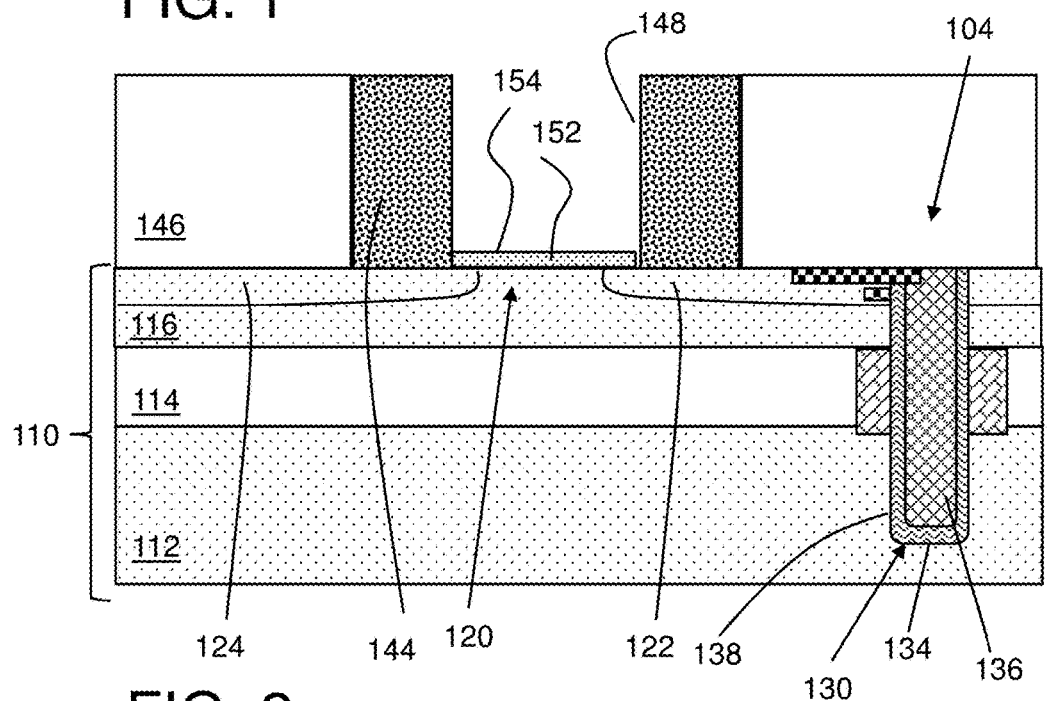
FIG. 2 shows a cross-sectional view of the initial structure after dummy gate removal and gate dielectric formation according to embodiments of the disclosure

FIGS. 2-5 show forming a gate stack 150 (FIG. 5) within opening space 148, i.e., within surrounding spacer 144. In FIG. 2, dummy gate 142 is removed, e.g., by etching. "Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as shallow isolation trenches (SIT).

FIG. 2 also shows forming a gate dielectric layer 152 having a planar upper surface 154 and a uniform thickness extending atop the entirety of device channel 120, i.e., within opening space 148. Gate dielectric layer 150 may be deposited, and may include any now known or later developed gate dielectric material such as silicon oxide. For the 32 nanometer technology node, for example, gate dielectric layer 150 may have a thickness of, for example, 2-4 nanometers (nm).

Figure 3:
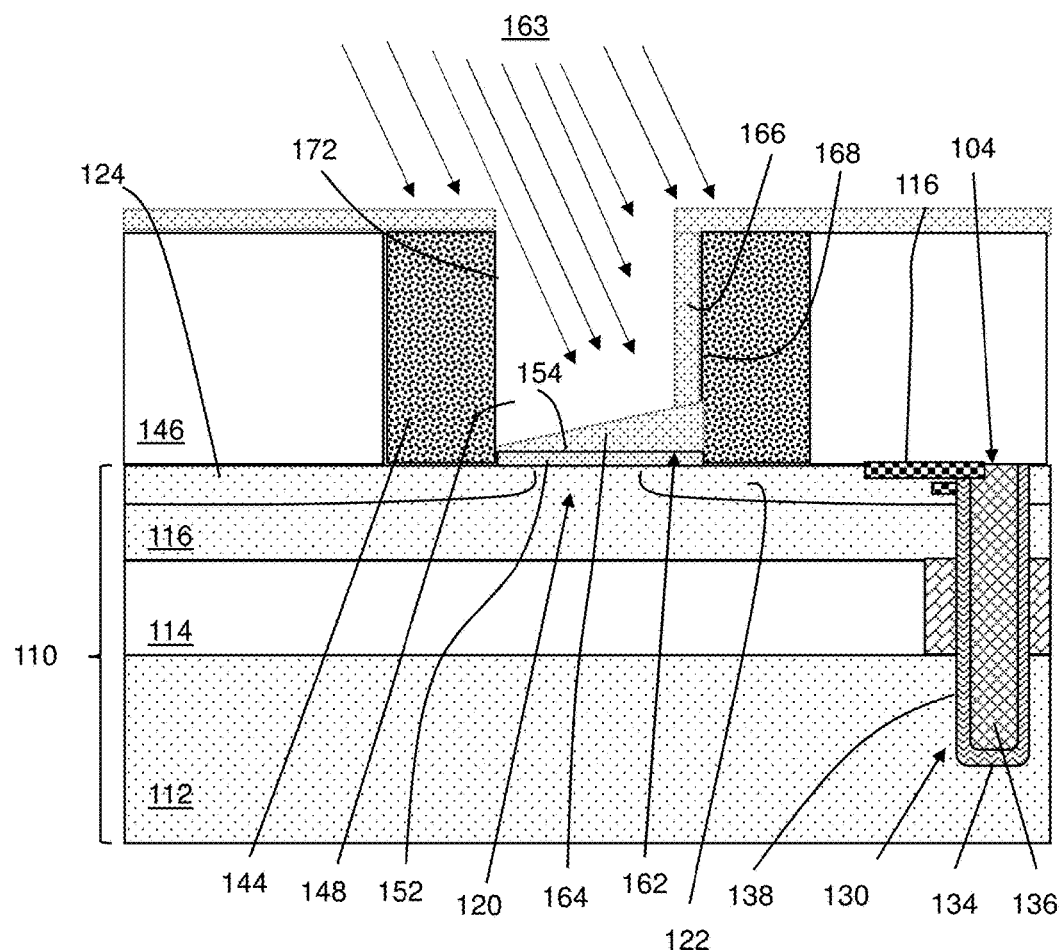
FIG. 3 shows a cross-sectional view of the structure undergoing high-K deposition according to embodiments of the disclosure.
Figure 5:
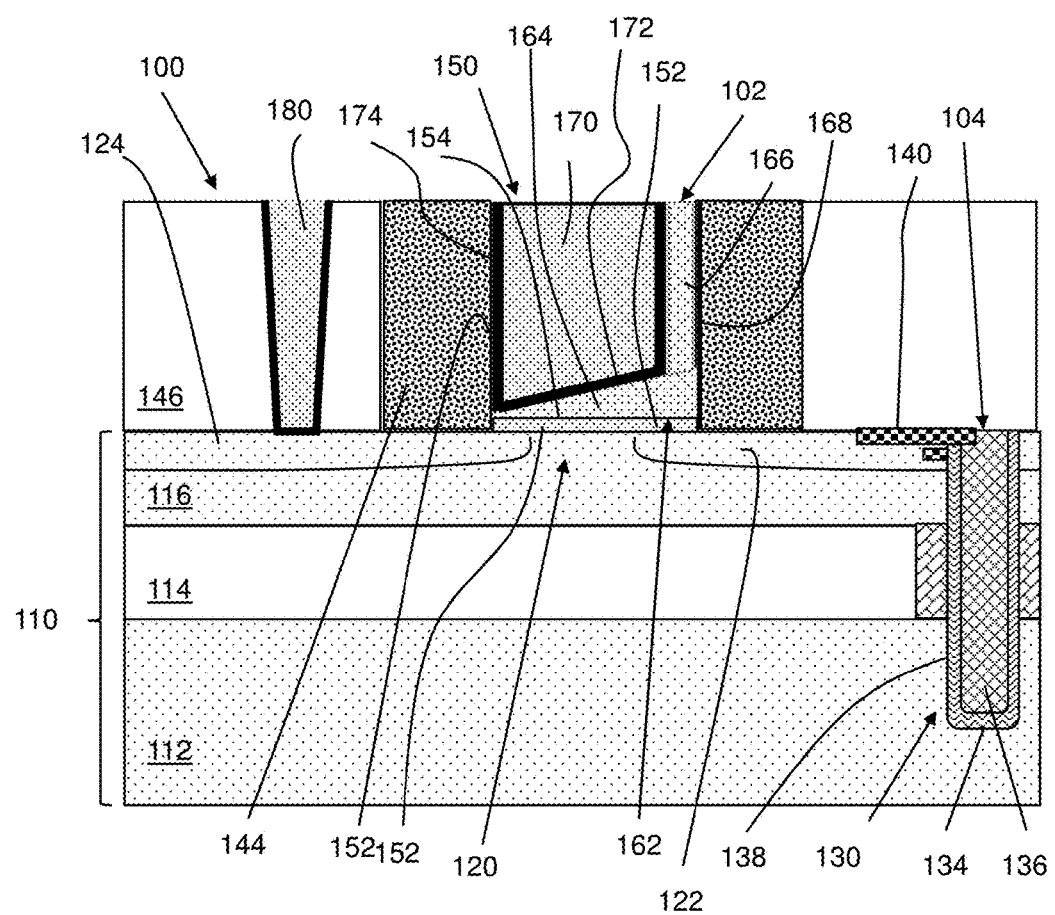
FIG. 5 shows a cross-sectional view of an asymmetrical transistor and a memory cell according to embodiments of the disclosure.

FIG. 3 shows forming a dielectric threshold voltage adjusting element 162 within opening space 148. "Threshold voltage adjusting element" denotes a layer or block of material that includes material(s) that can change the threshold voltage in on or more regions of gate stack 150 (FIG. 5). Dielectric threshold voltage adjusting element 162 may include a high dielectric constant (high-K) material such as but not limited to metal oxides including: tantalum oxide ($Ta_2O_5$), barium titanium oxide ($BaTiO_3$), hafnium oxide ($HfO_2$), zirconium oxide ($ZrO_2$), aluminum oxide ($Al_2O_3$) or metal silicates such as hafnium silicate oxide ($Hf_{A1}Si_{A2}O_{A3}$) or hafnium silicate oxynitride ($Hf_{A1}Si_{A2}O_{A3}N_{A4}$), where A1, A2, A3, and A4 represent relative proportions, each greater than or equal to zero and A1+A2+A3+A4 (1 being the total relative mole quantity). In one particular example, the high-K material includes hafnium oxide ($HfO_2$). In one embodiment, dielectric threshold voltage adjusting element 162 may be formed by depositing high-K material using an angled gas cluster ion beam (GCIB) 163 or directional deposition techniques. In any event, as shown in FIG. 3, dielectric threshold voltage adjusting element 162 may include: a sloped dielectric element 164 located on planar upper surface 154 of gate dielectric layer 152, and a sidewall dielectric element 166 extending from sloped dielectric element 164 along a first sidewall 168 of opening space 148 (FIG. 2). "Sloped" as used herein relative to dielectric threshold voltage adjusting element 162 indicates that the material layer or block has a different thickness from one edge thereof to another edge thereof. As will be further described, the different thickness of the same material provides a different threshold voltage depending on the thickness. More specifically, an edge (for example, left side of the paper) containing a smaller thickness of material provides a lower threshold voltage as compared to the other edge (for example, right side of the paper) of sloped dielectric element 164 having a larger thickness. Thus, a source threshold voltage for the right side is higher than a drain threshold voltage on the left side. Further, GIDL from the right side is also reduced with this structure. The thicknesses and angle of the slope may vary depending on the desired threshold voltages. In one example, the slope may be between approximately 20° and 40°, and perhaps approximately 30° degrees, i.e., relative to upper planar surface 154 of gate dielectric layer 152. Also, in one example, the thicknesses of sloped dielectric element 164 may range from approximately 2 nm or less to no more than approximately 10 nm. Sidewall dielectric element 166 may be approximately 2-6 nm thick. As will be described in greater detail, sidewall dielectric element 166 extending from sloped dielectric element 164 along first sidewall 168 of opening space 148 (FIG. 2) provides additional threshold voltage increase for that region, and reduces voltage leakage, e.g., capacitor 104 charge through source 122. The above specific value or ranges of slope, thickness of the sloped dielectric element 164, and/or sidewall dielectric element 166 may provide or produce a more practical and/or desirable device.

Figure 4A:
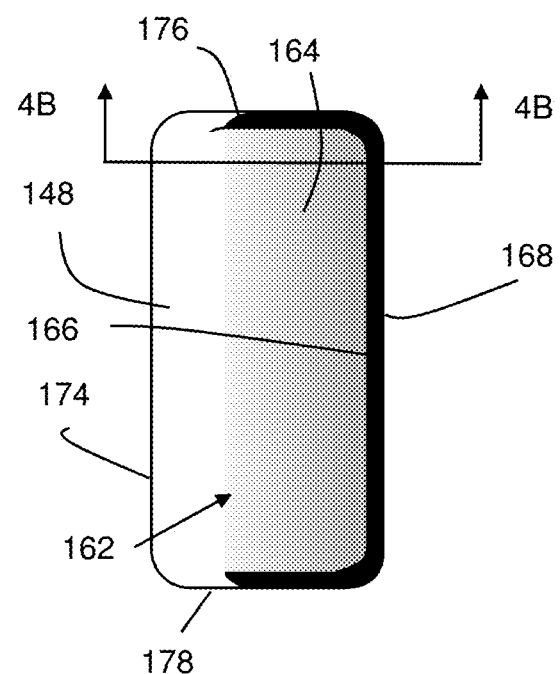
FIG. 4A shows a cross-sectional schematic plan view of a gate stack opening from FIG. 3.
Figure 4B:
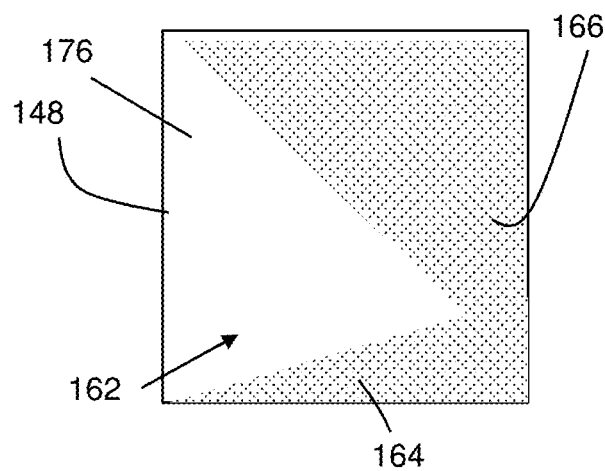
FIG. 4B shows a cross-sectional schematic front view of the opening at an end wall thereof along line 4B-4B of FIG. 4A.

FIGS. 1-3 and 5-7 show cross-sectional views of structure through a mid-region of opening space 148. FIG. 4A show a cross-sectional schematic plan view of opening space 148 of FIG. 3, and FIG. 4B shows a cross-sectional schematic front view of (gate stack) opening space 148 at an end wall 176 thereof along line 4B-4B of FIG. 4A. FIGS. 4A and 4B show dielectric threshold voltage adjusting element 162 after formation by angled GCIB deposition of high-K material. As observed in FIG. 4B, due to the angled GCIB application, sidewall dielectric element 166 (dark line in FIG. 4A) covers less of an internal periphery of opening space 148 adjacent sloped dielectric element 164 than at an upper region of opening space 148 at end wall 176 (or end wall 178) thereof. While opening space 148 is illustrated in FIG. 4A as having a generally rectangular cross-section, it is understood that it can have a variety of shapes, e.g., circular, oval, etc. In any event, at an end wall 176, 178 of opening space 148, dielectric threshold voltage adjusting element 162 increases in coverage of an internal periphery of opening space 148 from sloped dielectric element 164 to an upper region of opening space 148. The angled GCIB also allows for formation of sloped dielectric element 164.

FIG. 5 shows the last step of forming gate stack(s) 150 including forming a gate conductor 170 located atop an upper surface 172 of sloped dielectric element 164 and along a side of sidewall dielectric element 166. (Gate conductor 170 may be deposited after removal of excess high-K material from a surface of ILD layer 146, as shown in FIG. 3.) Gate conductor 170 may also be formed to contact with an opposing, second sidewall 174 of opening space 148 (FIG. 2) from first sidewall 168. Gate conductor 170 may include any now known or later developed gate conductor material such as but not limited to copper or tungsten. Gate conductor 170 may also include any conventional liner material (dark lines surrounding gate conductor 170) such as but not limited to a refractory metal liner such as ruthenium (Ru), tantalum (Ta), titanium (Ti), tungsten (W), iridium (Ir), rhodium (Rh) and platinum (Pt), or mixtures of thereof. Gate conductor 170 may be deposited and then planarized (e.g., using chemical-mechanical polishing) in a conventional manner. With gate stack 150 complete, asymmetric transistor 102 is provided. The asymmetry is within the different threshold voltages that can be achieved by sloped dielectric element 164 within the at least one gate stack 150 (FIG. 5). FIG. 5 also shows forming a contact 180 to drain 124 in a conventional manner. It is understood that subsequent BEOL processing can provide additional interconnections to contact 180 and gate conductor 170.

Referring to FIGS. 3 and 5, in one embodiment, for purposes of forming a memory cell 100 (FIG. 5), dielectric threshold voltage adjusting element 162 forming may include forming sloped dielectric element 164 having a greater thickness adjacent source 122 than adjacent drain 124. Further, the forming dielectric threshold voltage adjusting element 162 includes forming sidewall dielectric element 166, as a spacer, extending upwardly from sloped dielectric element 164 on an end thereof adjacent source 122. In this fashion, a higher threshold voltage is required relative to source 122, reducing voltage leakage during a storing mode of memory cell 100 and improving data retention within capacitor 104. More specifically, the thicker high-K dielectric in gate stack 150 closer to source 122 and sidewall dielectric element 166 (i.e., spacer) results in a lower gate-induced drain leakage (GIDL), and a higher threshold voltage (Vt) due to lower body effect and thick spacer. The Vt, and lower leakage, achieves longer retention of charge in capacitor 104. Similarly, a lower Vt is required relative to drain 124, allowing for better performance (e.g., lower power usage) during a writing mode of memory cell 100. That is, dielectric threshold voltage adjusting element 162 creates a threshold voltage that is lower in a writing mode (for drain) than in a storage mode (for source) of memory cell 100. More specifically, the thinner high K material in gate stack 150 closer to drain 124 results in higher GIDL, and a lower Vt due to the body effect, resulting in a high performance, low Vt in writing mode.

As shown in FIG. 5, asymmetric transistor 102 may include semiconductor substrate 110 having device channel 120 located between source 122 and drain 144 therein. Device channel 120, source 122 and drain 124 may be formed in SOI layer 116. As illustrated, in this embodiment for use with memory cell 100, source 122 is operatively coupled to capacitor 104. Source 122 may be operatively coupled to capacitor 104 in any now known or later developed fashion such as but not limited to conductive strap 140, e.g., doped semiconductor or a conductor, coupling source 122 to inner electrode 136 of capacitor 104. It will be understood that other connecting structures, e.g., contacts and metal lines, may be employed depending on the type of capacitor employed.

Asymmetric transistor 102 may also include at least one gate stack 150 located atop device channel 120 and within an opening space 148 of a surrounding spacer 144. Spacer 144 may include any conventional or later developed spacer material such as silicon nitride. According to embodiments of the disclosure, gate stack 150 may include from bottom to top: a gate dielectric layer 152 having planar upper surface 154 and a uniform thickness extending atop the entirety of device channel 120. In addition, and in contrast to conventional transistors, gate stack 150 may include dielectric threshold voltage adjusting element 162 including: sloped dielectric element 164 located on planar upper surface 154 of gate dielectric layer 152, and sidewall dielectric element 166 extending from sloped dielectric element 164 along first sidewall 168 of opening space 148. Gate stack 150 also includes gate conductor 170 located atop upper surface 172 of sloped dielectric element 164 and along a side of sidewall dielectric element 166. An interlayer dielectric layer (ILD) 146 may surround spacer 144.

Figure 6:
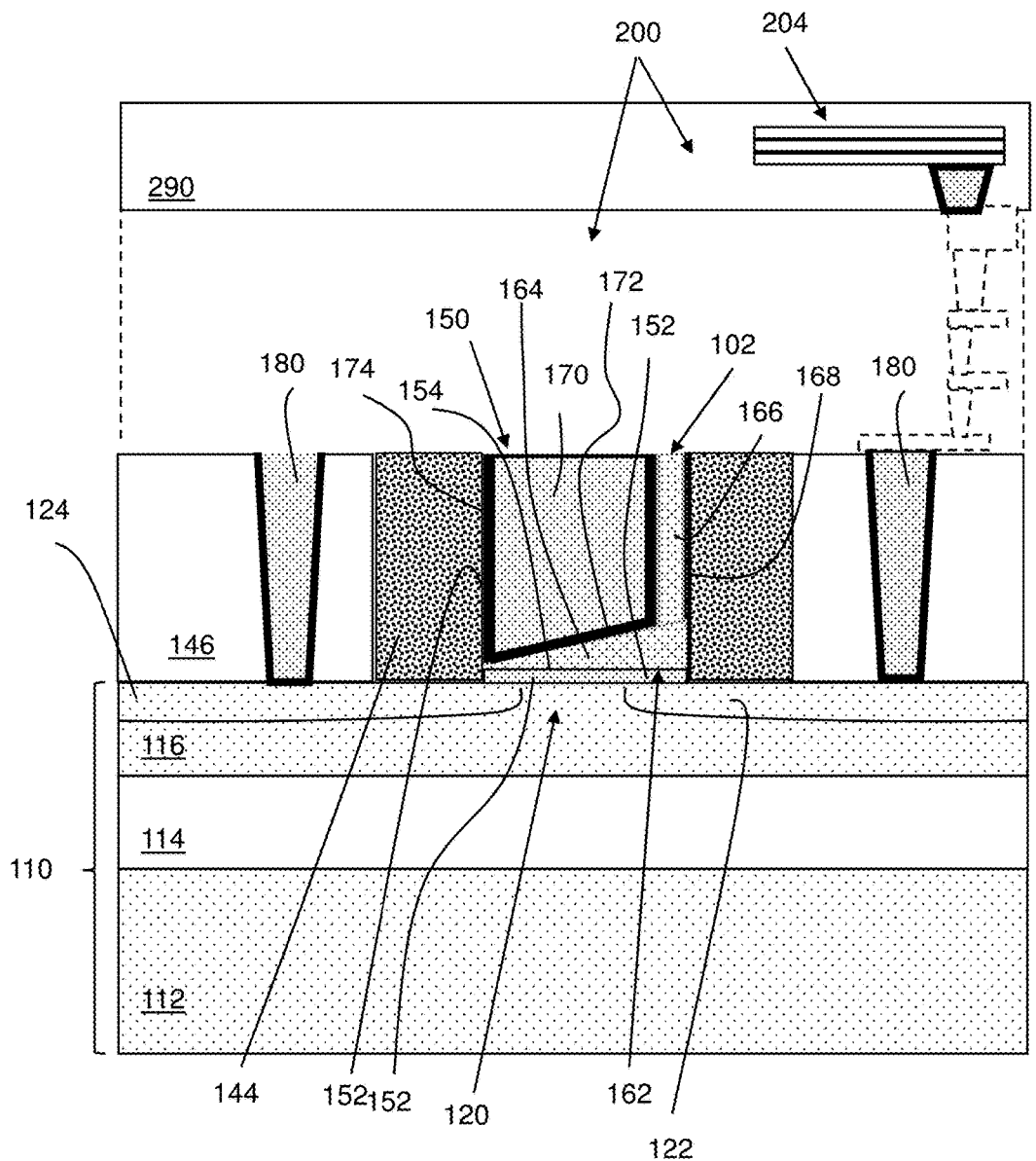
FIG. 6 shows a cross-sectional view of an asymmetrical transistor and a memory cell according to an alternative embodiment of the disclosure.
Figure 7:
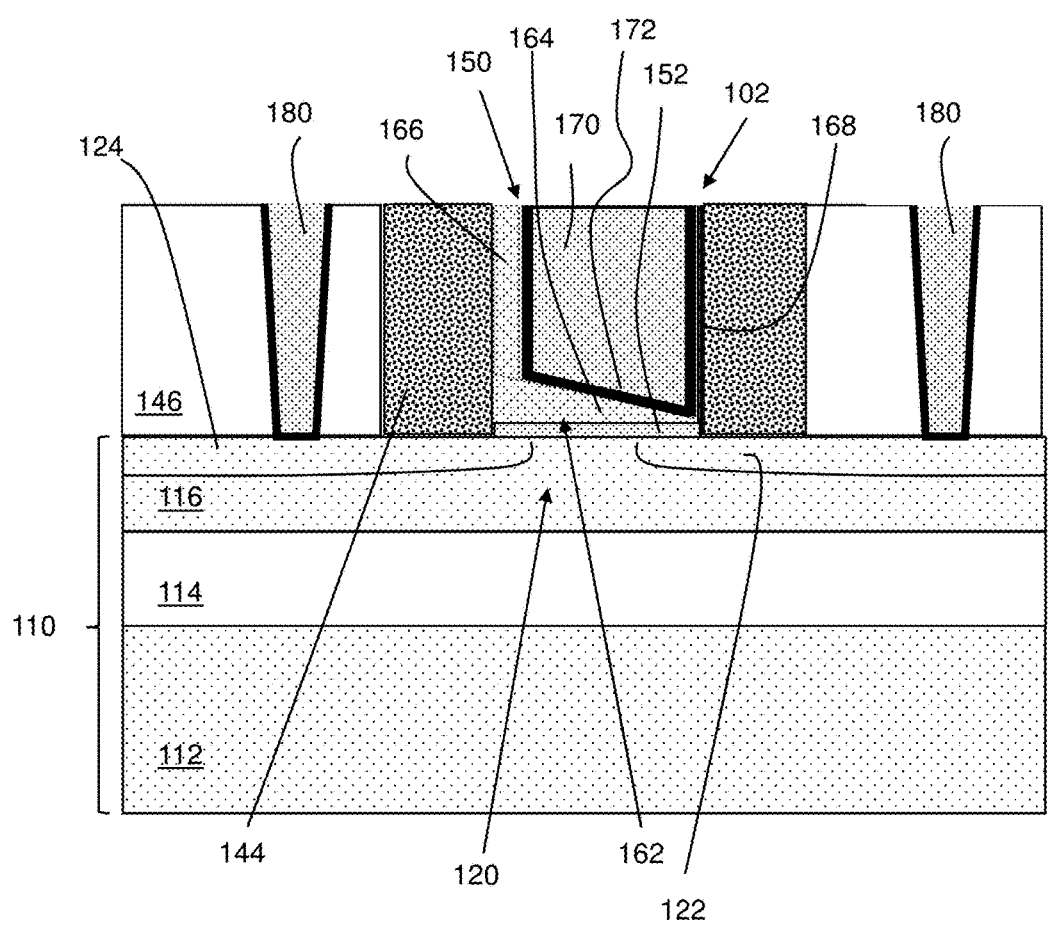
FIG. 7 shows a cross-sectional view of an asymmetrical transistor according to alternative embodiments of the disclosure.

FIGS. 6-7 show cross-sectional views according to alternative embodiments. FIG. 6 shows an embodiment of a memory cell 200 where the capacitor includes a MIM capacitor 204 in one or more BEOL layers 290. In this case, source 122 may be coupled to the MIM capacitor 204 by any now known or later developed interconnects, e.g., contacts 180 and metal wires, shown in phantom. As shown in FIG. 7, in another embodiment, dielectric threshold voltage adjusting element 162 may be reversed such that a thicker part of sloped dielectric adjusting element is over drain 124. This structure can be achieved by switching the angle of angled GCIB deposition of high-K material in FIG. 3, i.e., to aim towards drain 124 rather than source 122. FIG. 7 also shows application of asymmetric transistor 102 in an application other than a memory cell (FIGS. 5 and 6). While asymmetric transistor 102 has been described herein for use with memory cell 100, 200, it is emphasized that asymmetric transistor 102 may be used in any setting for which an asymmetric transistor is desired.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/− 10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A memory cell, comprising:
a capacitor; and
an asymmetric transistor for controlling access to the capacitor, the asymmetric transistor including
a device channel located between a source and a drain, the source operatively coupled to the capacitor, and
at least one gate stack located atop the device channel and within an opening space of a surrounding spacer, the at least one gate stack including, from bottom to top:
a gate dielectric layer having a planar upper surface and a uniform thickness extending atop an entirety of the device channel,
a dielectric threshold voltage adjusting element including: a sloped dielectric element located on the planar upper surface of the gate dielectric layer, and a sidewall dielectric element over the gate dielectric layer and extending from over the sloped dielectric element along a first sidewall of the opening space, and
a gate conductor located atop an upper surface of the sloped dielectric element and along a side of the sidewall dielectric element;
wherein the source has a higher threshold voltage than the drain.

2. The memory cell of claim 1, wherein the sloped dielectric element has a greater thickness adjacent the source than adjacent the drain.

3. The memory cell of claim 2, wherein the sidewall dielectric element extends upwardly from over the sloped dielectric element on an end thereof adjacent the source.

4. The memory cell of claim 1, wherein the gate conductor also contacts an opposing, second sidewall of the opening space from the first sidewall.

5. The memory cell of claim 1, wherein the dielectric threshold voltage adjusting element includes a high dielectric constant (high-K) material.

6. The memory cell of claim 5, wherein the high-K material includes hafnium oxide.

7. The memory cell of claim 1, wherein the sidewall dielectric element covers less of an internal periphery of the sidewall of the opening space adjacent the sloped dielectric element than at an upper region of the opening space.

8. The memory cell of claim 1, wherein the sidewall dielectric element extends upwardly from a portion of a top surface of the sloped dielectric element.

9. The memory cell of claim 8, wherein the portion of the top surface of the sloped dielectric element is located at an end of the sloped dielectric element thicker than an opposing end of the sloped dielectric element.

10. An asymmetric transistor, comprising:
a semiconductor substrate including a device channel located between a source and a drain;
at least one gate stack located atop the device channel and within an opening space of a surrounding spacer, the at least one gate stack including, from bottom to top:
  a gate dielectric layer having a planar upper surface and a uniform thickness extending atop an entirety of the device channel,
  a dielectric threshold voltage adjusting element including: a sloped dielectric element located on the planar upper surface of the gate dielectric layer, and a sidewall dielectric element over the gate dielectric layer and extending from over the sloped dielectric element along a first sidewall of the opening space, and
  a gate conductor located atop an upper surface of the sloped dielectric element and along a side of the sidewall dielectric element,
wherein the sloped dielectric element is thicker adjacent a selected one of the source and the drain than the sloped dielectric element is adjacent the other one of the source and the drain, and a threshold voltage in a region adjacent the selected one of the source and the drain is higher than a threshold voltage in the other one of the source and the drain.

11. The asymmetric transistor of claim 10, wherein the selected one of the source and the drain is the source.

12. The asymmetric transistor of claim 11, wherein the sidewall dielectric element extends upwardly from over the sloped dielectric element on an end thereof adjacent the source.

13. The asymmetric transistor of claim 10, wherein the gate conductor also contacts an opposing, second sidewall of the opening space from the first sidewall.

14. The asymmetric transistor of claim 10, wherein the dielectric threshold voltage adjusting element includes a high dielectric constant (high-K) material.

15. The asymmetric transistor of claim 14, wherein the high-K material includes hafnium oxide.

16. The asymmetric transistor of claim 10, wherein the sidewall dielectric element extends upwardly from a portion of a top surface of the sloped dielectric element.

17. The asymmetric transistor of claim 16, wherein the portion of the top surface of the sloped dielectric element is located at the thicker end of the sloped dielectric element.

* * * * *